United States Patent
Schroeder et al.

(10) Patent No.: US 7,405,024 B2
(45) Date of Patent: Jul. 29, 2008

(54) LITHOGRAPHIC MASK, AND METHOD FOR COVERING A MASK LAYER

(75) Inventors: Uwe Paul Schroeder, Hopewell Junction, NY (US); Oliver Broermann, Dresden (DE)

(73) Assignee: Infineon Technologies AG, Munich (DE)

( * ) Notice: Subject to any disclaimer, the term of this patent is extended or adjusted under 35 U.S.C. 154(b) by 704 days.

(21) Appl. No.: 10/952,559

(22) Filed: Sep. 28, 2004

(65) Prior Publication Data

US 2005/0106475 A1 May 19, 2005

(30) Foreign Application Priority Data

Sep. 30, 2003 (DE) ............... 103 45 476

(51) Int. Cl.
*G03F 1/14* (2006.01)
(52) U.S. Cl. ............ 430/5; 430/271.1; 430/273.1; 359/507
(58) Field of Classification Search ............ 430/5, 430/20
See application file for complete search history.

(56) References Cited

U.S. PATENT DOCUMENTS

| 5,928,817 | A | 7/1999 | Yan et al. | |
|---|---|---|---|---|
| 6,566,021 | B2 * | 5/2003 | Wang | 430/5 |
| 6,841,309 | B1 * | 1/2005 | Alpay et al. | 430/5 |
| 2004/0067424 | A1 * | 4/2004 | Schilz et al. | 430/5 |

FOREIGN PATENT DOCUMENTS

DE 38 42 481 A1 6/1989

OTHER PUBLICATIONS

Speight, James G. Lange's Handbook of Chemistry (16th Edition). McGraw-Hill.☐☐Online version available at:☐☐http://www.knovel.com/knovel2/Toc.jsp?BookID=1347&VerticalID=0.*
Maex, Karen; Van Rossum, Marc Properties of Metal Silicides. (pp. 242-243). Institution of Engineering and Technology.☐☐Online version available at:☐☐http://www.knovel.com/knovel2/Toc.jsp?BookID=1134&VerticalID=0.*

* cited by examiner

*Primary Examiner*—Mark F. Huff
*Assistant Examiner*—Jonathan Jelsma
(74) *Attorney, Agent, or Firm*—Slater & Matsil, L.L.P.

(57) ABSTRACT

A lithographic mask having a mask substrate (3) and a patterned mask layer (4) which includes mask structures (5) and can be transferred by lithography to a further substrate is disclosed. With masks of this type, it is customary for a protective layer to be provided in the form of a membrane positioned at a distance from the mask layer (4), in order to keep impurity particles or other impurities away from the focal plane of the mask layer (4). According to the invention, the protective layer (6) is applied in liquid form directly to the mask structures (5) and fills up spaces between the mask structures (4). Then, the protective layer (6), while it is still in the liquid state, is covered with a plane-parallel plate. The continuously dense protective layer (6) which is formed in accordance with the invention is even more reliable in preventing impurity particles or impurities (20) from penetrating into spacers between the structures (5) of the mask layer (4). The impurity particles or impurities (20) can only be deposited on the outer side (16) of the protective layer (6), at a still greater distance from the focal plane.

18 Claims, 3 Drawing Sheets

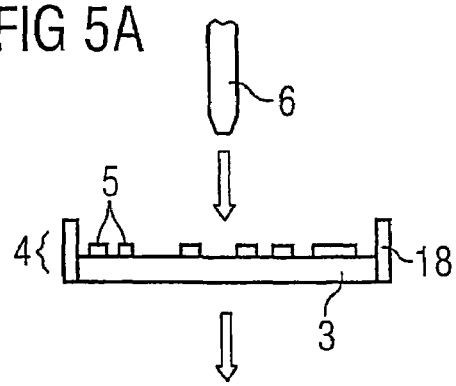
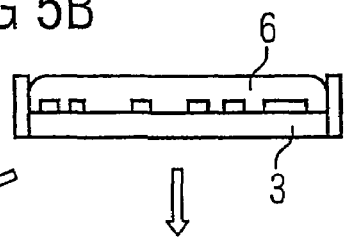
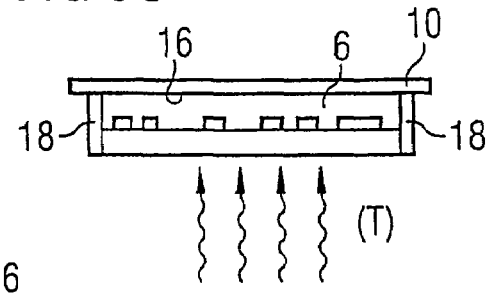
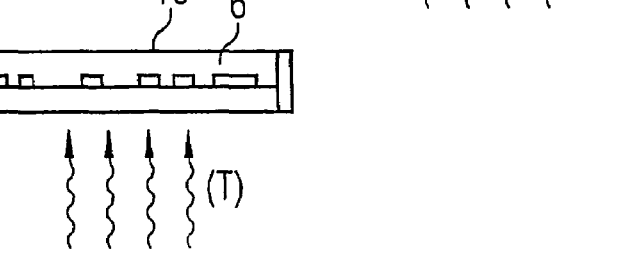
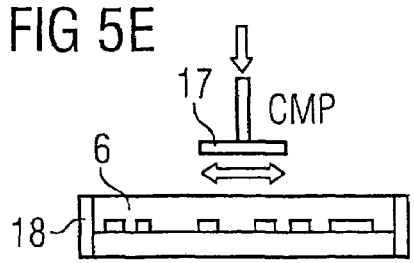

LITHOGRAPHIC MASK, AND METHOD FOR COVERING A MASK LAYER

This application claims priority to German Patent Application 103 45 476.4, which was filed Sep. 30, 2003, and is incorporated herein by reference.

TECHNICAL FIELD

The invention relates to a lithographic mask having a mask substrate and having a patterned mask layer, which is arranged on one side of the mask substrate and includes mask structures. The invention also relates to a method for covering a patterned mask layer, which includes mask structures and can be transferred by lithography, of a mask with a protective layer.

BACKGROUND

Lithographic masks (reticles) are used in semiconductor fabrication to transfer structure patterns, which are formed thereon, of a ready-patterned mask layer onto a substrate, in particular a semiconductor substrate or a wafer, on a reduced scale with the aid of lithographic exposure. Regions of the substrate that correspond to the transmissive mask regions are exposed and can be patterned, etched or exposed to ion implantations and other processing steps selectively with respect to unexposed surface regions. The mask may be a transmission mask or, as is customary in particular in the range of very short wavelengths of just a few nanometers, a reflection mask. Different transmission or reflection at mask structures and the spaces between them lead to the optical transfer of the mask pattern to the substrate, which is to be exposed.

A lithographic mask is exposed a number of times per wafer, in order for in each case different regions of the wafer to be exposed. Furthermore, in mass production a multiplicity of semiconductor wafers are exposed using a single mask.

Over the course of time, impurity particles and other impurities may be deposited on the mask, having an adverse effect on the quality of the optical imaging and leading to defects on the structure which is imaged on a reduced scale onto the exposed semiconductor wafers. In particular, in the region of the focal plane of the mask layer, the mask structures and spaces between the mask structures of the mask layer, defining the position of the unexposed and exposed regions on the semiconductor wafer, are distorted if, for example, a foreign particle enters a space between adjacent mask structures where it leads to local shadowing of a corresponding region on the semiconductor wafer, which as a result is not exposed as intended. This produces defects in the semiconductor circuits, which are fabricated.

To avoid such defects, it is true that it is possible for a mask to be cleaned at relatively long intervals, but this operation is complex and increases production costs.

To prevent the deposition of impurities or impurity particles in the focal plane of the mask layer, a flexible or fixed membrane, known as a pellicle, is often arranged at a certain height above the outer side of the mask layer. This membrane is secured along the edge of the mask with the aid of a membrane holder or pellicle frame. The membrane transmits light and does not impede the optical imaging, but also keeps impurity particles away from the outer side of the mask.

However, the membrane holder is provided with openings at the edge, in order to allow pressure compensation in the event of differing air pressure conditions, for example during transport in air, and to avoid pressure-induced damage. Therefore, even when a pellicle is fitted, contact with the clean-room air is possible via the openings in the pellicle frame, and over the course of time this leads to contamination of the patterned mask layer. These contaminations, for example caused by ammonium sulfide, amines, sulfur oxides or impurity particles, are present in trace amounts even in clean-room air and, once they have penetrated between the pellicle and the mask layer, cannot be removed again without complex cleaning. On the other hand, completely closing up the pellicle frame would no longer allow pressure compensation.

U.S. Pat. No. 5,928,827 A and German Patent No. 38 42 481 A1 have disclosed lithographic masks whose mask structures are covered with a continuously dense protective layer. These continuously dense protective layers keep impurity particles away from the mask structures more reliably. However, the production of continuously dense protective layers involves more time and labor, since their surface, which is remote from the mask layer, has to be planarized at considerable cost in order not to adversely affect the quality of the optical imaging. In particular, on account of the greater layer thickness of the continuously dense protective layers compared to pellicle membranes, much lower roughness and deviations in the surface of the protective layer from the position parallel to the mask substrate are permissible in the case of the continuously dense protective layers.

SUMMARY OF THE INVENTION

In one aspect, the present invention provides an inexpensive mask and an inexpensive method for producing it in which impurities caused by impurity particles are reliably prevented and at the same time a high quality of the optical imaging is ensured.

According to a preferred embodiment of the invention, a lithographic mask is designed to have a mask substrate and a patterned mask layer that is arranged on one side of the mask substrate, has mask structures and can be transferred by lithography to a layer of a further substrate. The mask, on that side of the mask substrate on which the patterned mask layer is arranged, has a protective layer to protect the mask layer from contact with impurity particles. The protective layer is applied directly to the mask structures and fills up spaces between the mask structures of the mask layer. The protective layer, on its outer side, is in contact with a plane-parallel plate, which covers the protective layer.

According to embodiments of the invention, the principle of arranging protective layers that are used as a shield against impurity particles and other impurities as far away as possible from the focal plane of the patterned masked layer is reversed, and instead the protective layer is introduced directly onto and into the focal plane defined by the mask structures and the spaces between them. The protective layer completely fills up the spaces between the mask structures and also covers the top side of the mask structures, i.e., it forms a continuously dense, planarizing filling which may extend well above the height of the mask structures and replaces the volume of air which is customarily shielded by a membrane arranged at a distance from the mask substrate. The continuously dense protective layer in direct contact with the mask structures and the mask substrate which is uncovered in the spaces between the mask structures is insensitive to fluctuations in air pressure. Moreover, the continuously dense, compact protective layer keeps impurities and impurity particles away from the focal plane even more reliably than can be achieved with the aid of a pellicle mounted by means of a frame. The protective layer is deposited at least up to the height of the mask structures, but is generally thicker, in order to ensure a sufficient distance between its top side and the mask layer, such that impurity particles which strike its top side no longer have a significant adverse effect on the optical imaging. This removal of impurity particles from the focal plane by the "thickening" of the mask layer in accordance with the invention obviates the need for any subsequent mounting of sensitive membranes or other complex means.

According to embodiments of the invention, there is provision for the protective layer, on its outer side, to be in contact with a plane-parallel plate, which covers the protective layer. In this case, the protective layer need neither be hardened nor polished, since the plane-parallel plate likewise imparts a plane formation to the top side of the protective layer. In particular, there is no need for machining steps, which entail work and costs and are conventionally required to impart a plane form to the outer side of the protective layer. If the protective layer is hardened after it has been brought into contact with the plane-parallel plate, the plane-parallel plate can subsequently be removed or can be left on the mask.

It is preferable for the plane-parallel plate, in an outer region of the mask, to be held in a parallel position to the mask substrate by spacers. The spacer then at the same time predetermines the layer thickness of the protective layer.

It is preferable for the plane-parallel plate to be arranged outside the focal plane of the structured mask layer and for the space between the focal plane and the plane-parallel plate to be completely filled up by the protective layer.

It is preferable for the protective layer to predominantly comprise a liquid-deformable, cured and transparent material. Even at layer thicknesses of millimeters or a few centimeters, the protective layer material, which transmits the lithographic exposure wavelength used in each case, has only a slight influence on the optical quality of the structure transmission. The material of the protective layer is preferably a material which is deformable as long as it is in the liquid state but has already cured and therefore no longer changes its contour. A cured material of this type can be applied to the mask with the exposed patterned mask layer by simply being dropped onto it or by being spun on, but on the other hand, after it has fully cured allows solid-state machining, for example chemical-mechanical polishing of its surface, in order to allow perfect optical imaging. It is, therefore, possible for materials, which would not normally be suitable, on account of the need for the protective layer to be arranged at a minimum distance from the focal plane of the mask layer, to be used as protective layer material.

It is preferable for the protective layer to extend from the mask substrate up to a height above the mask structures. The height of its top side above the top side of the mask structures determines the extent to which disruptive influences of impurity particles on the optical imaging are eliminated; with regard to focusing aspects, it is recommended for the layer thickness of the protective layer to be maximized, whereas on the other hand, the material of the protective layer itself should not unnecessarily impair the beam profile.

It is preferable for the material of the protective layer to be a polymer, an acrylate, a methacrylate, a silicone or a silicate. Furthermore, all materials, which are applied in liquid form as a spin-on glass and can be cured, for example, by a heat treatment or other form of treatment, are also suitable.

The mask may be a phase mask in which the refractive index of the patterned mask layer and the refractive index of the protective layer differ from one another by at least 0.5. Accordingly, the material of the protective layer is selected in such a way that a sufficient difference in refractive index is achieved, preferably also with respect to the material of the mask substrate. A difference in refractive index of at least 0.03 allows the thickness of the patterned mask layer to be selected to be relatively low, which is advantageous for sharp optical imaging.

Another embodiment provides a method for covering a patterned mask layer, which includes mask structures and can be transferred by lithography, in which a protective layer is provided on a side of a mask substrate on which the patterned mask layer is arranged. The protective layer is formed by a material for the protective layer being applied in the liquid state directly to the mask structures and into spaces between the mask structures and by this material being covered, in the liquid state, by a plane-parallel plate.

According to embodiments of the invention, the protective layer is applied in the liquid state, and in the liquid state is covered with a plate, preferably a plane-parallel plate. Therefore, machining of the top side of the protective layer is not imperative. The protective layer can be applied by spinning on a liquid material, by immersing at least one side of the mask in a liquid comprising protective layer material or by means of other processes. It is optionally possible to carry out an additional polishing operation. The reason for a polishing operation may, for example, be to even more accurately set the thickness of the protective layer.

The plane-parallel plate is preferably placed onto a spacer, which holds the plane-parallel plate in a position parallel to the substrate. The spacer may be a conventional pellicle frame, but may also be a plurality of pins or elevations of limited cross-section, which support the plane-parallel plate at just a few points, preferably along the periphery of the mask substrate.

The protective layer can be cured after it has been applied. It may also subsequently be polished on its outer side. Furthermore, the plane-parallel plate can be removed again after curing of the protective layer.

It is preferable for the protective layer applied to be a continuously dense material in a layer thickness, which is at least double the layer thickness of the mask layer. The thickness of the protective layer may be up to a few centimeters and, on the other hand, may be only slightly greater than the layer thickness of the patterned mask layer. In any event, however, the top side of the protective layer should be sufficiently far away from the top side of the mask structures. The thicker the protective layer, the further away impurity particles and impurities resting on it or on the plane-parallel plate are away from the focal plane of the mask layer, which is located approximately halfway up the mask structures.

BRIEF DESCRIPTION OF THE DRAWINGS

The invention is described below with reference to the figures, in which:

FIGS. 5A to 5E show method steps involved in a method according to the invention for applying a protective layer to a patterned mask layer.

Figure 1:
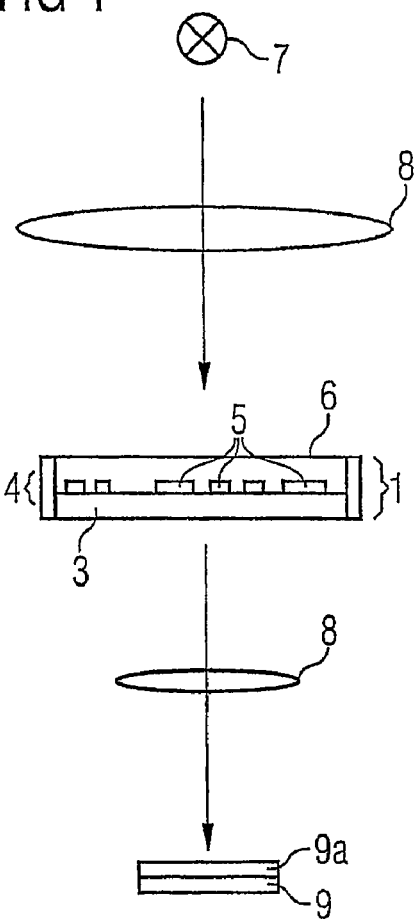
FIG. 1 diagrammatically depicts a lithographic exposure operation.

The following list of reference symbols can be used in conjunction with the figures:

| | |
|---|---|
| 1 | Mask |
| 2 | Focal plane |
| 3 | Mask substrate |
| 4 | Mask layer |
| 5 | Mask structure |
| 6 | Protective layer |
| 7 | Light source |
| 8 | Optical system |
| 9 | Substrate to be exposed |
| 9a | Layer to be exposed |
| 10 | Plane-parallel plate |
| 16 | Outer side |
| 17 | Polishing tool |
| 18 | Spacer |
| 19 | Opening |
| 20 | Impurity particles or contamination |
| n1 | Refractive index of the mask layer |
| n2 | Refractive index of the protective layer |
| n3 | Refractive index of the mask substrate |

DETAILED DESCRIPTION OF ILLUSTRATIVE EMBODIMENTS

Preferred embodiments of the invention will now be described with the figures. Referring first to in FIG. 1 electromagnetic radiation from a light source 7 passes through an optical system 8 and through a mask 1 onto a substrate 9, which is to be exposed by lithography or onto a layer 9a, which is to be exposed on the substrate 9. The system is used to transfer a structure of the mask 1 onto the substrate 9. Regions of the exposed substrate, which correspond to the structures 5 of the patterned mask layer 6 are shadowed and can be removed or retained selectively with respect to exposed regions. As an alternative to the case of a transmission mask illustrated in FIG. 1, the mask 1 may also be a reflection mask. In both cases, the mask substrate 3 prevents impurity particles from forming or being deposited from just one side. From the other side, it is customary to provide a pellicle, which is held as a protective layer 6 at a distance from the patterned mask layer 4 and prevents the deposition of impurities.

Figure 2:
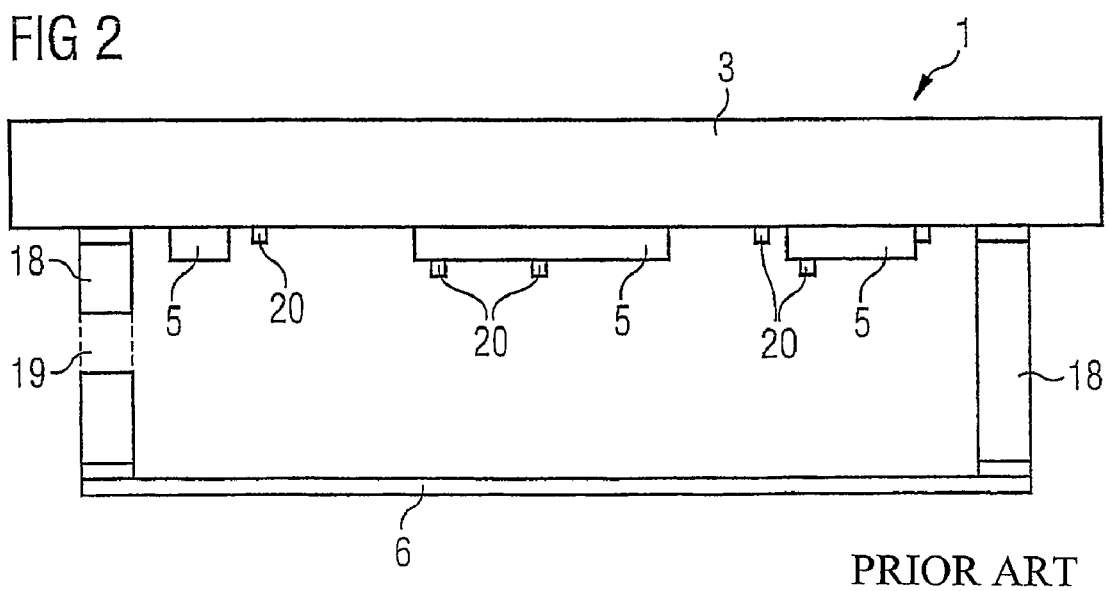
FIG. 2 shows a cross-section through a conventional lithographic mask.

FIG. 2 shows an enlarged illustration of the mask substrate from FIG. 1. The mask 1 is in this figure upside-down relative to the alignment show in FIG. 1. The membrane which serves as protective layer 6, is secured to a pellicle frame 18 and stretched over the surface of the mask substrate. The layer 6 is located at a distance from the height of the structures 5 of the mask layer 4, the size of which is exaggerated in FIG. 2. Pellicle frames 18, as illustrated on the left-hand side of FIG. 2, conventionally have openings 19 through which pressure compensation between the volumes inside and outside the mask is possible and through which, in particular in the event of prolonged use of a mask in mass production of integrated semiconductor products, contamination can penetrate, which then settles on the uncovered mask structures 5 and distort the transferred pattern of the mask structure in particular in the region of the openings located between them. The contamination 20 may be impurity particles, layer deposits, dust, crystal formations, etc.

Figure 3:
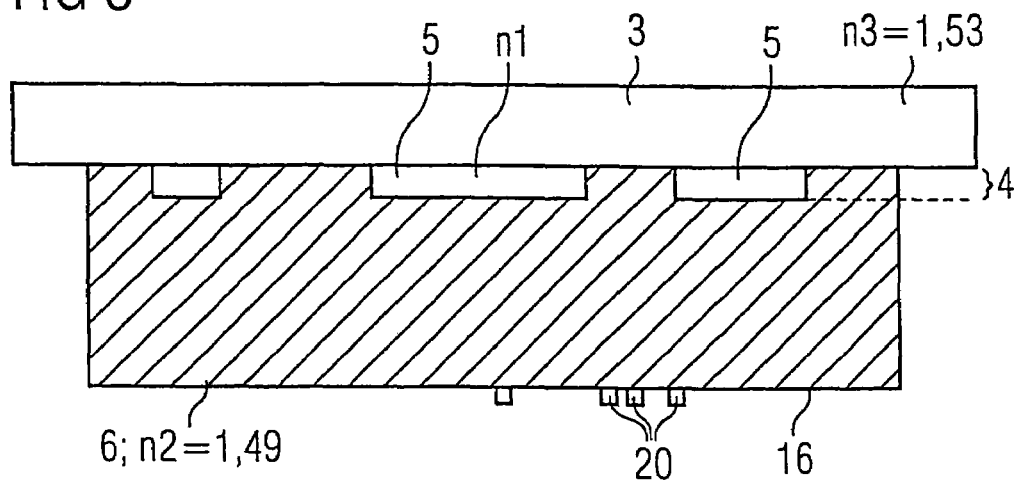
FIG. 3 shows a cross-section through a lithographic mask according to the invention.

To keep this contamination away, the mask according to the embodiment illustrated in FIG. 3 has a protective layer 6, which is applied as a continuously dense layer directly to the structures 5 and the spaces between them on the surface of the mask substrate 3. Contamination 20, which is deposited on the outer side 16 of the protective layer 6, is now so far outside the focal plane of the mask that it can no longer have any adverse effect on the optical imaging and also can no longer completely shadow partial regions of the recesses of the patterned mask layer 4.

Figure 4:
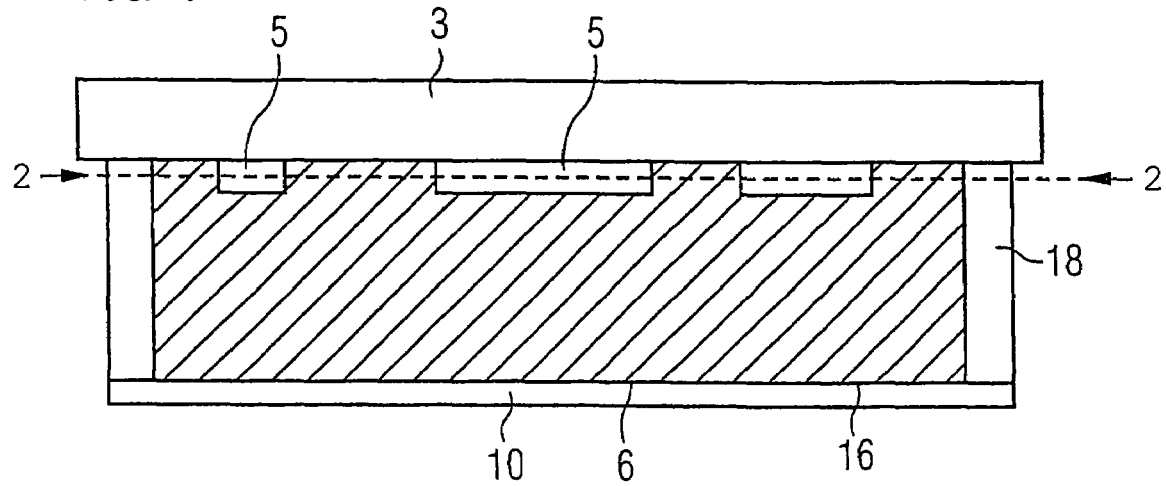
FIG. 4 shows a cross-section through a refinement of the lithography mask according to the invention.

FIG. 4 shows the position of the focal plane 2, which lies approximately in the center of the layer thickness of the patterned mask layer 4. At the same time, FIG. 4 shows a refinement of the invention in which the outer side 16 of the protective layer 6 is delimited and defined by a plane-parallel plate 10. The plane-parallel plate used may, for example, also comprise materials employed for conventional hard pellicles which are mounted on a pellicle frame 18. Glass plates are also suitable for this purpose. The spacer 18 serves to set the layer thickness of the protective layer 6 and prevent the protective layer material from flowing away over the edge of the mask substrate.

The refractive index n2 of the protective layer should differ from the refractive index of the structures 5 of the mask layer 4 and preferably also from the refractive index of the material of the mask substrate 3, so that in the case of a phase mask the structures provided for the phase shift can make do with a limited layer thickness which does not excessively reduce the focusing of the optical imaging.

FIGS. 5A to 5E show a method according to the invention for applying a protective layer to a patterned mask layer. The preferably liquid material for the protective layer 6 may, as illustrated in FIG. 5A, be applied from a pipette or similar dropping device to the mask substrate and the initially uncovered mask structures 5 of the mask layer 4 arranged thereon. The lateral dispersion of the protective layer material can be boosted, for example, by means of a spin-on process. Spacers 18 arranged at the edge can prevent relatively large quantities of the protective layer material from flowing away, in particular in the case of relatively thick protective layers.

In accordance with FIG. 5B, the protective layer 6 is applied in liquid form and may, for example, as provided in a first alternative of the method according to the invention shown in FIG. 5C, first of all be covered with a plane-parallel plate 10, the underside of which in this way defines the top side 16 of the protective layer 6. This eliminates the need for polishing or other machining operations to planarize the outer side of the protective layer. Then, as shown in FIG. 5C, the protective layer is optionally cured, for example by a heat treatment, i.e., by the temperature being increased to temperature T.

According to a second alternative of the method according to the invention, it is possible, starting from FIG. 5B, for the protective layer 6 to be cured first of all, in which case volatile substances can more readily diffuse out at the uncovered top side 16 of the protective layer on account of the temperature being increased to temperature T. The material of the protective layer 6, which has been cured in accordance with FIG. 5D, can then be planarized by means of chemical-mechanical polishing CMP with the aid of a polishing tool 17; in this case too, the spacers 18 can be used to set the height or layer thickness of the protective layer 6.

The lithographic mask which has been refined in accordance with the embodiments shown in FIG. 5C or 5E completely encloses the structures 5 of the mask layer 4 from both sides, specifically by means of the mask substrate 3 and by means of the protective layer 6. Impurity particles and other impurities can, therefore, only be deposited on the outer sides of the protective layer 6 and of the mask substrate 3, i.e., in both cases at a considerable distance from the focal plane of the mask layer 4. Consequently, distortion of the mask structure as a result of contaminated masks is no longer possible. Furthermore, since the mask according to the invention no longer contains a volume of air, there is also no longer any need for pressure compensation through the spacers 18.

The method according to embodiments of the invention can be used, for example, to refine COG (Chrome On Glass) masks. Furthermore, embodiments of the invention have the advantage that it is impossible for any atmospheric humidity to precipitate directly in the focal plane, thereby preventing transmission through the permeable mask regions. The outer side of the continuously dense protective layer 6 may be configured as an optical surface, i.e., in non-plane form, for example as a lens surface, in order to compensate for changes caused by the longer optical path length in the protective layer material or other effects on the optical beam passage. The exposure wavelength recommended for use may, for example, be the UV region, for example wavelengths of 248, 193, 157 nm or other wavelengths. The continuously dense protective layer 6 protects the mask from mechanical damage, in particular in the region of the structures 5 of the mask layer 4. Also, the mask overall is more stable, since it is designed to be continuously dense over a greater thickness. It is preferable to use homogeneous materials for the protective layer 6, in particular materials, which do not cause any birefringence. In particular, crosslinked or linear polymers can be used as the protective layer material. Furthermore, acrylates and methacrylates are suitable for wavelengths of 193 nm, and silicates and silicones are suitable for wavelengths of 157 nm.

Forming the protective layer in accordance with the preferred embodiment of the invention as a continuously dense layer which is applied directly to the patterned layer reduces the costs of substrate exposure, since the cleaning steps which are customarily required can be dispensed with. The fact that the protective layer prevents small particles from having an adverse effect on the optical imaging increases the yield of the lithographic exposure. Embodiments of the invention can be applied to any form of lithographic exposure, even outside semiconductor fabrication. The lithographic mask may, for example, be a chromeless phase mask, an alternating phase mask or any other desired, conventionally known mask.

What is claimed is:

1. A lithographic mask comprising:
   a mask substrate;
   a patterned mask layer arranged on one side of the mask substrate, the patterned mask layer having mask structures that can be transferred by lithography to a layer of a further substrate;
   a protective layer overlying the patterned mask layer of the mask substrate, the protective layer directly contacting the mask structures and filling up spaces between the mask structures of the patterned mask layer; and
   a plane-parallel plate overlying and in contact with the protective layer,
   wherein the plane-parallel plate is arranged outside a focal plane of the patterned mask layer, and wherein a space between the focal plane and the plane-parallel plate is completely filled up by the protective layer; and wherein the protective layer has a layer thickness that is at least double a layer thickness of the patterned mask layer.

2. The mask as claimed in claim 1, wherein the protective layer is configured to protect the patterned mask layer from contact with impurity particles.

3. The mask as claimed in claim 1, further comprising spacers, wherein the plane-parallel plate, in an outer region of the mask, is held in a parallel position to the mask substrate by the spacers.

4. The mask as claimed in claim 1, wherein the protective layer comprises a transparent, curable or cured material that is deformable in the liquid state.

5. The mask as claimed in claim 1, wherein the protective layer extends from the mask substrate up to a height above the mask structures.

6. The mask as claimed in claim 1, wherein the protective layer comprises a material that contains a polymer, an acrylate, a methacrylate, a silicone or a silicate.

7. The mask as claimed in claim 1, wherein the mask comprises a phase shift mask in which a refractive index of the patterned mask layer and a refractive index of the protective layer differ from one another by at least 0.03.

8. A method for making a mask, the method comprising:
   providing a mask that includes a patterned mask layer, the mask comprising mask structures that can be transferred by lithography;
   forming a protective layer over a surface of a mask substrate on which the patterned mask layer is arranged, the protective layer being formed by applying a material in a liquid state directly onto the mask structures and into spaces between the mask structures; and
   covering the protective layer, in the liquid state, with a plane-parallel plate in contact with the protective layer,
   wherein the protective layer has a layer thickness that is at least double a layer thickness of the patterned mask layer.

9. The method as claimed in claim 8, further comprising placing the plane-parallel plate onto spacers that hold the plane-parallel plate in a position substantially parallel to the mask substrate.

10. The method as claimed in claim 8, further comprising curing the material of the protective layer after it has been applied and covered with the plane-parallel plate.

11. The method as claimed in claim 10, further comprising removing the plane-parallel plate from the protective layer after the material of the protective layer has cured.

12. The method as claimed in claim 8, wherein the protective layer comprises a continuously dense material.

13. The method as claimed in claim 8, wherein the protective layer has a layer thickness that is at least double a layer thickness of the patterned mask layer.

14. A method of forming a semiconductor device, the method comprising:
   providing a mask that comprises mask structures arranged on a surface of a mask substrate and a protective layer that overlies and directly contacts the mask structures and fills up spaces between the mask structures, wherein providing the mask comprises forming the mask, the forming comprising covering a protective layer, in a liquid state, with a plane-parallel plate in contact with the protective layer;
   directing electromagnetic radiation toward the mask; and
   directing the electromagnetic radiation from the mask toward a semiconductor wafer such that a pattern of the mask structures is transferred to a layer of the semiconductor wafer,
   wherein the protective layer has a layer thickness that is at least double a layer thickness of the patterned mask layer.

15. The method of claim 14, wherein the plane-parallel plate overlies and is in contact with the protective layer.

16. The method of claim 14, wherein directing the electromagnetic radiation toward the mask comprises directing the electromagnetic radiation through the mask.

17. The method of claim 14, wherein directing the electromagnetic radiation from the mask comprises reflecting the electromagnetic radiation from the mask.

18. The method of claim 14, wherein forming the mask further comprises:

providing the mask substrate that includes the mask structures; and forming the protective layer by applying a material in a liquid state directly to the mask structures and into spaces between the mask structures prior to covering the protective layer.

* * * * *